United States Patent
Matsubara (10) Patent No.: US 7,138,676 B2
(45) Date of Patent: Nov. 21, 2006

(54) SEMICONDUCTOR DEVICE AND MANUFACTURING THE SAME HAVING MULTIPLE TRENCHES FORMED IN PLURAL ELEMENT REGIONS OR TRENCH GROUPS

(75) Inventor: Yoshinori Matsubara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/866,176

(22) Filed: Jun. 14, 2004

(65) Prior Publication Data

US 2005/0017283 A1    Jan. 27, 2005

(30) Foreign Application Priority Data

Jun. 23, 2003 (JP) ............................ P2003-178235

(51) Int. Cl.
*H01L 27/108* (2006.01)
(52) U.S. Cl. ....................................... 257/301; 257/304
(58) Field of Classification Search ................ 257/301, 257/304, 305
See application file for complete search history.

(56) References Cited

U.S. PATENT DOCUMENTS

| | | | | |
|---|---|---|---|---|
| 5,378,906 A | * | 1/1995 | Lee | .............................. 257/296 |
| 5,559,350 A | * | 9/1996 | Ozaki et al. | ................. 257/304 |
| 5,600,162 A | * | 2/1997 | Rosner | ...................... 257/311 |
| 5,747,844 A | * | 5/1998 | Aoki et al. | .................. 257/296 |
| 6,172,898 B1 | | 1/2001 | Kajiyama | |
| 6,339,239 B1 | * | 1/2002 | Alsmeier et al. | ........... 257/296 |
| 6,521,938 B1 | | 2/2003 | Hamamoto | |
| 6,831,320 B1 | * | 12/2004 | Beer | ........................... 257/301 |

* cited by examiner

*Primary Examiner*—Gene M. Munson
(74) *Attorney, Agent, or Firm*—Foley & Lardner LLP (57) ABSTRACT

A semiconductor device in which a plurality of rows are set along an X direction and a plurality of columns are set along a Y direction orthogonal to the X direction, comprises a first element region including a first trench disposed in a first column at one end thereof and a second trench disposed in a second column parallel to the first column at the other end thereof; a second element region including a third trench disposed at a position closer to the second trench than the first trench in the first column at one end thereof and a fourth trench disposed in the second column at the other end thereof; and a third element region including a fifth trench disposed at a position closer to the fourth trench than the third trench in the first column at one end thereof and a sixth trench disposed in the second column at the other end thereof.

11 Claims, 8 Drawing Sheets

SEMICONDUCTOR DEVICE AND MANUFACTURING THE SAME HAVING MULTIPLE TRENCHES FORMED IN PLURAL ELEMENT REGIONS OR TRENCH GROUPS

CROSS-REFERENCE TO RELATED APPLICATIONS

This application is based upon and claims the benefit of priority from the prior Japanese Patent Application No. 2003-178235, filed Jun. 23, 2003, the entire contents of which are incorporated herein by reference.

FIELD OF THE INVENTION

The present invention relates to a semiconductor device, particularly to a semiconductor device having trenches.

BACKGROUND OF THE INVENTION

As a semiconductor device having trenches, a trench capacitor memory cell of a DRAM is well known.

Improvement in the integration degree of a memory device such as the DRAM has been advanced year by year. Thus, process development has not been able to keep up with reduction in a memory cell size. It has emerged that, if trenches, for example, deep trenches (DTs) are used to form capacitors of DRAM memory cells, there is a close relationship between a layout of the DTs and a process margin.

SUMMARY OF THE INVENTION

A semiconductor device in which a plurality of rows are set along an X direction and a plurality of columns are set along a Y direction orthogonal to the X direction according to an embodiment of the present invention comprises a first element region including a first trench disposed in a first column at one end thereof and a second trench disposed in a second column parallel to the first column at the other end thereof, a second element region including a third trench disposed at a position closer to the second trench than the first trench in the first column at one end thereof and a fourth trench disposed in the second column at the other end thereof; and a third element region including a fifth trench disposed at a position closer to the fourth trench than the third trench in the first column at one end thereof and a sixth trench disposed in the second column at the other end thereof.

A semiconductor device in which a plurality of rows are set along an X direction and a plurality of columns are set along a Y direction orthogonal to the X direction according to another embodiment of the present invention comprises a first trench group formed at respective intersections of odd-numbered rows and odd-numbered columns among the plurality of rows and columns, a second trench group formed at respective intersections of even-numbered rows and even-numbered columns among the plurality of rows and columns, and an element region group which connects trenches formed at positions corresponding to coordinates (C, R) among the first trench group with trenches formed at positions corresponding to coordinates (C+1, R+3) among the second trench group, respectively.

DETAILED DESCRIPTION OF THE INVENTION

Figure 8:
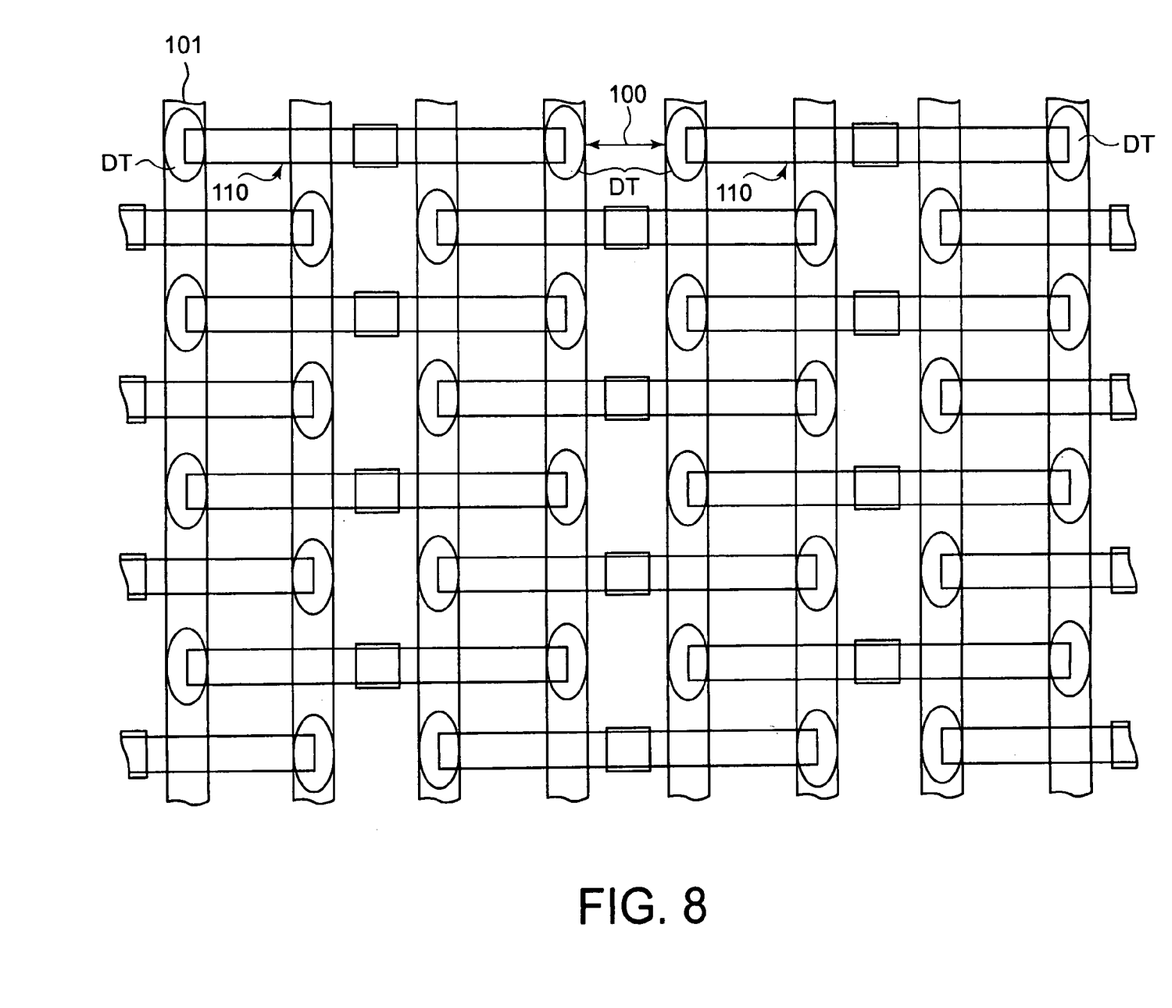
FIG. 8 is a view showing a typical layout example of a DRAM.

FIG. 8 is a plan view showing a memory cell array of a DRAM. The memory cell array shown in FIG. 8 is a layout commonly called "½ pitch shifted layout", which is described in, for example, FIG. 1, FIG. 10 and the like of a patent document (Japanese Patent Laid-Open Publication No. Hei 11 (1999)-168194).

As shown in FIG. 8, in "½ pitch shifted layout", layout patterns of element regions are shifted by ½ pitch between odd-numbered columns and even-numbered columns. One of advantages of this layout is that active portions and pass portions can be alternately obtained for a word line 101 in the odd-numbered columns and the even-numbered columns and that a structure of bit lines is easily formed to be a folded bit line structure.

In a conventional layout typified by "½ pitch shifted layout", when attention is focused on one column, a portion with a short DT-DT distance appears. The portion is, particularly, a portion where element regions 110 are adjacent to each other such as a portion indicated by reference numeral 100 in FIG. 8. In the portion with the short DT-DT distance, restrictions on processes are strict in pattern transfer and DT formation. For example, in the DT formation, etching around a DT opening in a mask material proceeds faster than etching of a flat portion of the mask material. Thus, in the portion with the short DT-DT distance, a residual film amount of the mask material is smaller than that of the flat portion. Due to such restrictions on processes, it is difficult to deepen the DT and to increase an aspect ratio of the DT.

As described above, in a conventional semiconductor device having trenches, there are parts where restrictions on the layout and on processes are strict. As a result, it is becoming difficult to further shrink the semiconductor device having trenches.

With reference to the drawings, embodiments of the present invention will be described below based on examples of application to a dynamic random access memory (DRAM). In the description, the same parts are denoted by the same reference numerals throughout the drawings.

(First Embodiment)

Figure 1A:
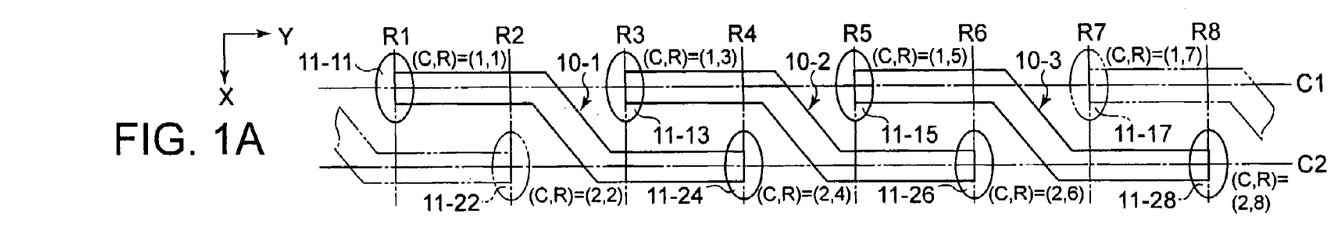
FIG. 1A is a plan view showing one layout example when element regions and trenches of a memory cell array of a DRAM are formed according to a first embodiment of the present invention.
Figure 1B:
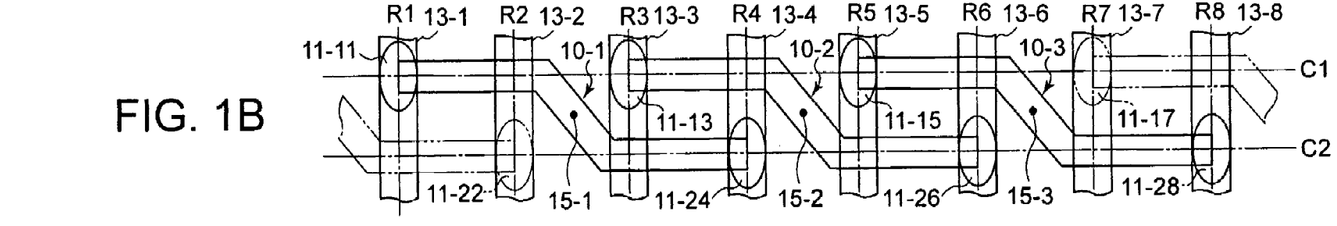
FIG. 1B is a plan view showing one layout example when word lines of the memory cell array of the DRAM are formed according to the first embodiment of the present invention.
Figure 1C:
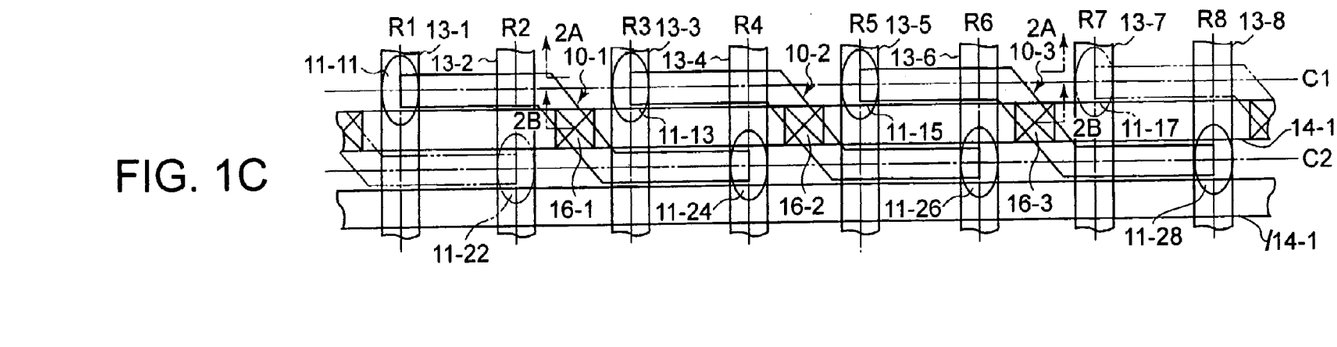
FIG. 1C is a plan view showing one layout example when bit line contacts and bit lines of the memory cell array of the DRAM are formed according to the first embodiment of the present invention.
Figure 2A:
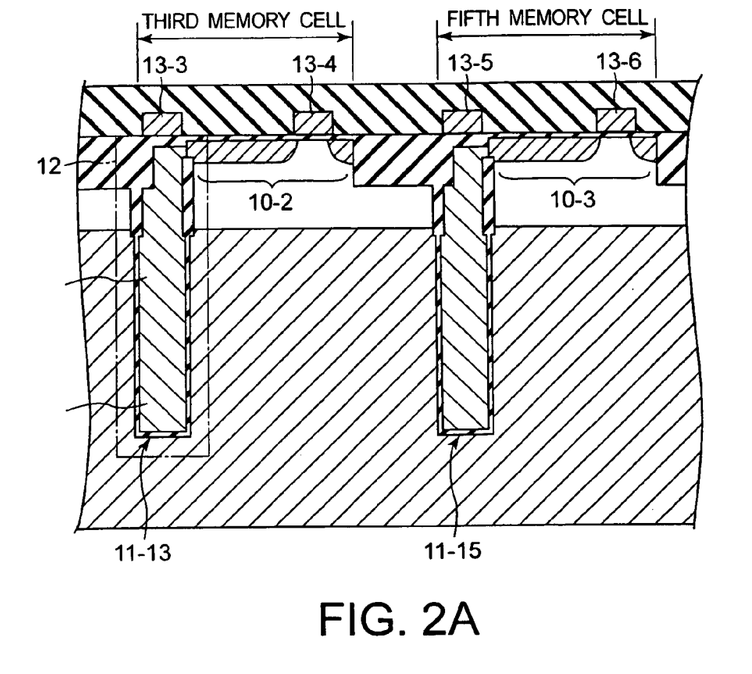
FIG. 2A is a cross-sectional view taken along the line 2A—2A in FIG. 1C.
Figure 2B:
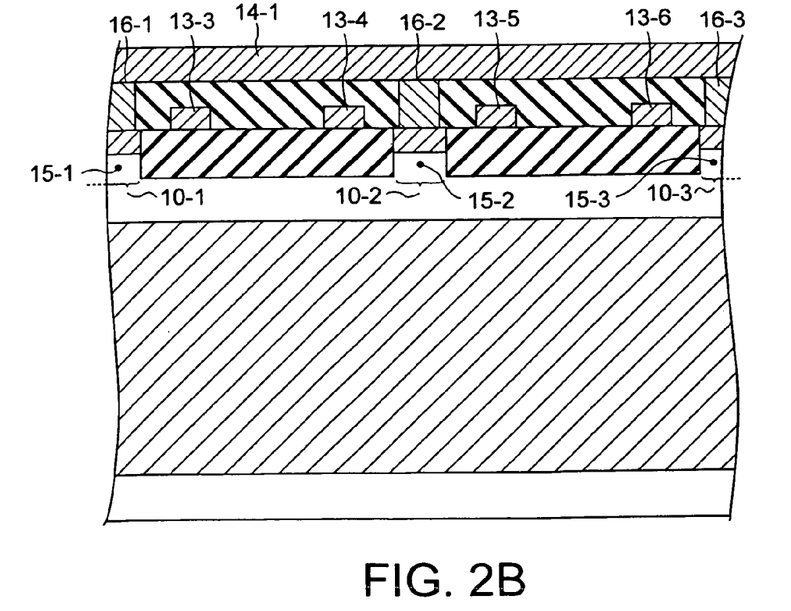
FIG. 2B is a cross-sectional view taken along the line 2B—2B in FIG. 1C.

FIGS. 1A to 1C are plan views showing one layout example of a memory cell array of a DRAM according to a first embodiment of the present invention. FIG. 1A is a plan view when element regions and trenches are formed, FIG. 1B is a plan view when word lines are formed and FIG. 1C is a plan view when bit line contacts and bit lines are formed. Moreover, FIG. 2A is a cross-sectional view taken along the line 2A—2A in FIG. 1C and FIG. 2B is a cross-sectional view taken along the line 2B—2B in FIG. 1C.

As shown in FIGS. 1A to 1C and FIGS. 2A and 2B, in the memory cell array according to this example, rows are set along an X direction and columns are set along a Y direction orthogonal to the X direction. FIGS. 1A to 1C show first to eighth rows R1 to R8 and first and second columns C1 and C2.

In this embodiment, as a basic layout pattern, for example, first to third element regions 10-1 to 10-3 are included.

First element region 10-1 has a first trench 11-11 at one end thereof and a second trench 11-24 at the other end thereof. First trench 11-11 is disposed at an intersection of first column C1 and first row R1. Second trench 11-24 is disposed at an intersection of second column C2 and fourth row R4.

Similarly, second element region 10-2 has a third trench 11-13 at one end thereof and a fourth trench 11-26 at the other end thereof. Third trench 11-13 is disposed at an intersection of first column C1 and third row R3. Fourth trench 11-26 is disposed at an intersection of second column C2 and sixth row R6.

Third element region 10-3 has a fifth trench 11-15 at one end thereof and a sixth trench 11-28 at the other end thereof. Fifth trench 11-15 is disposed at an intersection of first column C1 and fifth row R5. Sixth trench 11-28 is disposed at an intersection of second column C2 and eighth row R8.

Note that (C, R) shown in FIG. 1A are coordinates attached for convenience in the present specification in order to indicate layout positions of the respective trenches. "C" corresponds to the column number and "R" corresponds to the row number. For example, since first trench 11-11 is disposed in the first column and the first row, coordinates (C, R) thereof are (1, 1). Since second trench 11-24 is disposed in the second column and the fourth row, coordinates (C, R) thereof are (2, 4).

In this embodiment, trenches formed at respective intersections of the odd-numbered rows and the odd-numbered column among the plurality of rows and columns are set to be a first trench group and trenches formed at respective intersections of the even-numbered rows and the even-numbered column are set to be a second trench group. The first trench group is formed at positions corresponding to the coordinates (C, R) and is formed at positions corresponding to coordinates (C+1, R+3) among the second trench group.

In this embodiment, the first, third and fifth trenches are formed at the respective intersections of the odd-numbered rows and the odd-numbered column and the second, fourth and sixth trenches are formed at the respective intersections of the even-numbered rows and the even-numbered column.

The first to sixth trenches 11-11, 11-24, 11-13, 11-26, 11-15 and 11-28 are deep trenches. The deep trenches are deeper than shallow trenches for forming element isolation regions. In the respective deep trenches, trench capacitors 12 are formed. One structural example of the trench capacitor 12 is shown within a dashed line in FIG. 2A. In the deep trench, a trench capacitor other than the trench capacitor according to the one structural example may be formed.

The first embodiment is an example in which the present invention is applied to the memory cell array of the DRAM. Thus, in first to third element regions 10-1 to 10-3, dynamic memory cells are formed, respectively. One example of the memory cell is a so-called 1 transistor-1 capacitor memory cell, which includes one transfer transistor and one trench capacitor 12. The transfer transistor has word lines 13 (13-1 to 13-8) as gate electrodes and connects trench capacitors 12 to bit lines 14 (14-1 and /14-1) according to potential of the gate electrodes. Word lines 13 (13-1 to 13-8) are disposed so as to correspond to the first to eighth rows R1 to R8, respectively. In this example, word lines 13-1, 13-3, 13-5 and 13-7 which are disposed so as to correspond to the odd-numbered rows (R1, R3, R5 and R7) among word lines 13 (13-1 to 13-8) become passing word lines on the odd-numbered column (column C1) and become active word lines on the even-numbered column (column C2). Moreover, word lines 13-2, 13-4, 13-6 and 13-8 which are disposed so as to correspond to the even-numbered rows (R2, R4, R6 and R8) become active word lines on the odd-numbered column (column C1) and become passing word lines on the even-numbered column (column C2). Below the respective passing word lines, trenches are formed.

In first element region 10-1, a first memory cell disposed in first column C1 and a second memory cell disposed in second column C2 are formed. The first memory cell includes a trench capacitor formed in first trench 11-11 and the second memory cell includes a trench capacitor formed in second trench 11-24. A transfer transistor of the first memory cell has word line 13-2 as a gate electrode and a transfer transistor of the second memory cell has word line 13-3 as a gate electrode. First element region 10-1 has an oblique portion 15-1 which intersect obliquely with the Y direction from first column C1 toward second column C2 between word lines 13-2 and 13-3. The first and second memory cells are connected to each other via oblique portion 15-1.

Bit line 14-1 is electrically connected to the first and second memory cells via a first bit line contact 16-1. First bit line contact 16-1 is provided in oblique portion 15-1. Thus, first bit line contact 16-1 is shared by the first and second memory cells. Second and third element regions 10-2 and 10-3 also have a constitution similar to that of the first element region.

Bit line contacts 16-1 to 16-3 are connected to bit line 14-1.

Figure 3:
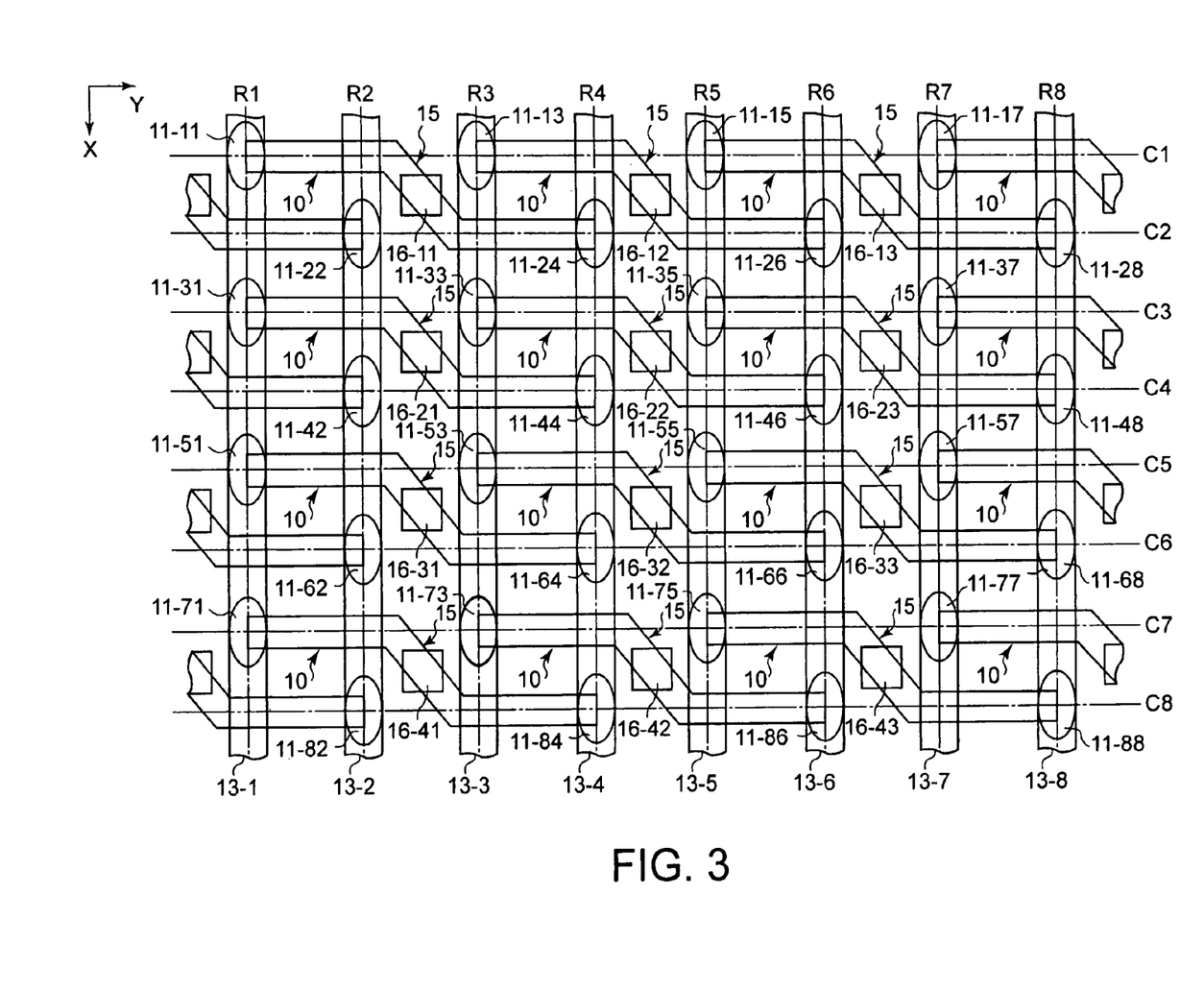
FIG. 3 is a plan view of a memory cell array formed by use of the layout examples shown in FIGS. 1A to 1C.

FIG. 3 is a plan view of a memory cell array formed by use of the one layout example shown in FIGS. 1A to 1C. Note that, in FIG. 3, the bit line is omitted.

In the memory cell array shown in FIG. 3, memory cells adjacent to each other along the Y direction in odd-numbered columns C1, C3, C5, C7, . . . are memory cells disposed on the left side of the paper of FIG. 3 as viewed from bit line contacts 16. Moreover, memory cells adjacent to each other along the Y direction in even-numbered columns C2, C4, C6, C8, . . . are memory cells disposed on the right side of the paper as viewed from bit line contacts 16. Specifically, the memory cells are disposed to have the same phase along the Y direction.

In the respective rows R1 to R8, along the X direction, the memory cells disposed on the right side of the paper and the memory cells disposed on the left side of the paper as viewed from bit line contacts 16 appear alternately. Specifically, the memory cells are disposed to have opposite phase along the X direction.

Figure 4A:
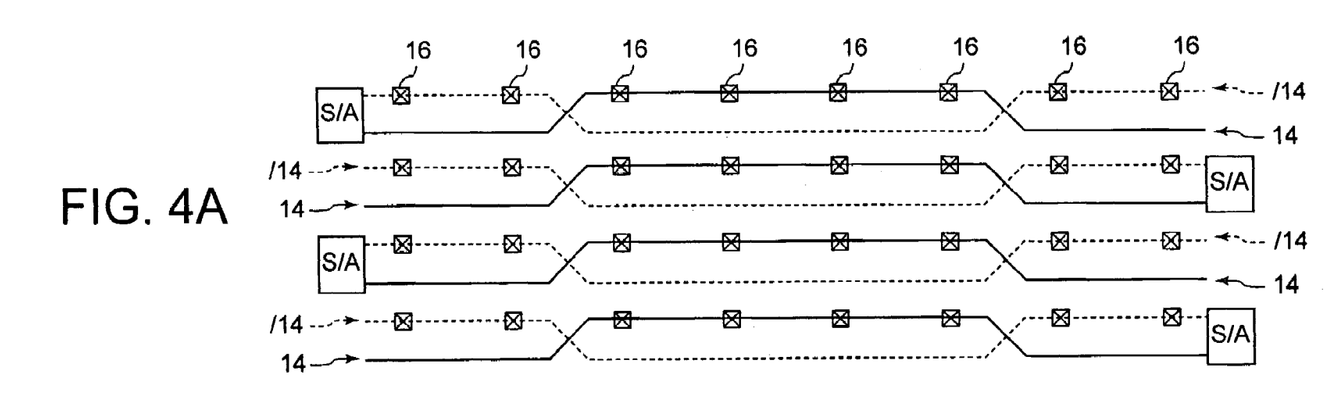
FIG. 4A is a view showing one example of a bit line.
Figure 4B:
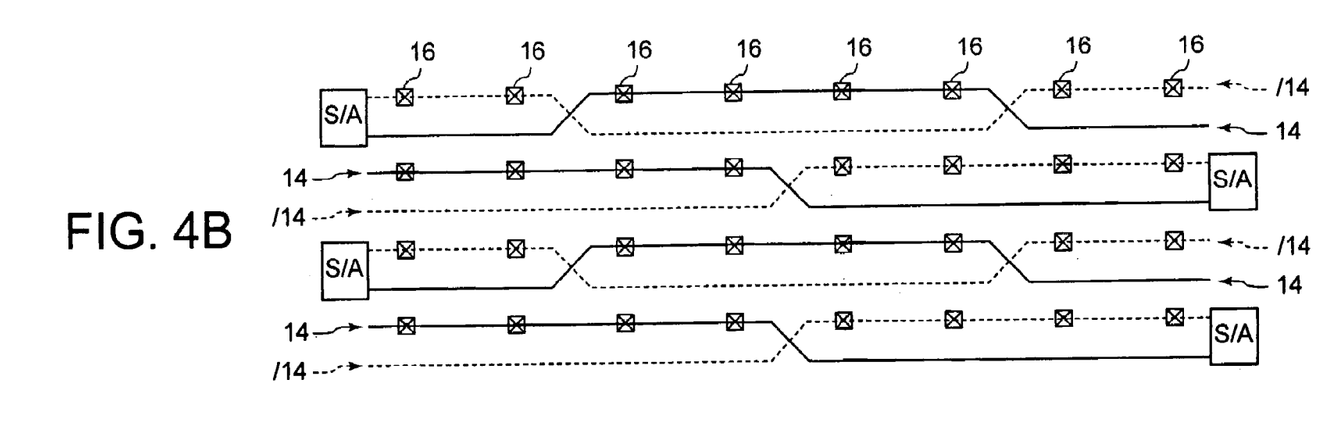
FIG. 4B is a view showing another example of the bit line.

In this example, bit line contacts 16 are disposed in a straight line along the Y direction between columns C1 and C2, between columns C3 and C4, between columns C5 and C6 and between columns C7 and C8. If, for example, bit line 14 is a folded bit line, as shown in FIGS. 4A and 4B, bit lines 14 and /14 are twisted with each other such that the same number of memory cells are connected thereto. In this embodiment, such a bit-line pair is called a "folded and twisted bit-line pair". Positions of twisting may be disposed linearly as shown in FIG. 4A or may be shifted zigzag as shown in FIG. 4B.

In the folded and twisted bit-line pair shown in FIG. 4A, the leftmost bit line contact 16 (the first bit line contact) and the second bit line contact 16 from the left (the second bit line contact) are connected to one bit line /14 (the first bit line) of the bit line pair. In addition, the third (to the sixth) bit line contacts 16 from the left (the third bit line contacts) are connected to the other bit line (the second bit line) of the bit line pair. The first bit line intersects with the second bit line between the second and third bit line contacts.

Figure 5:
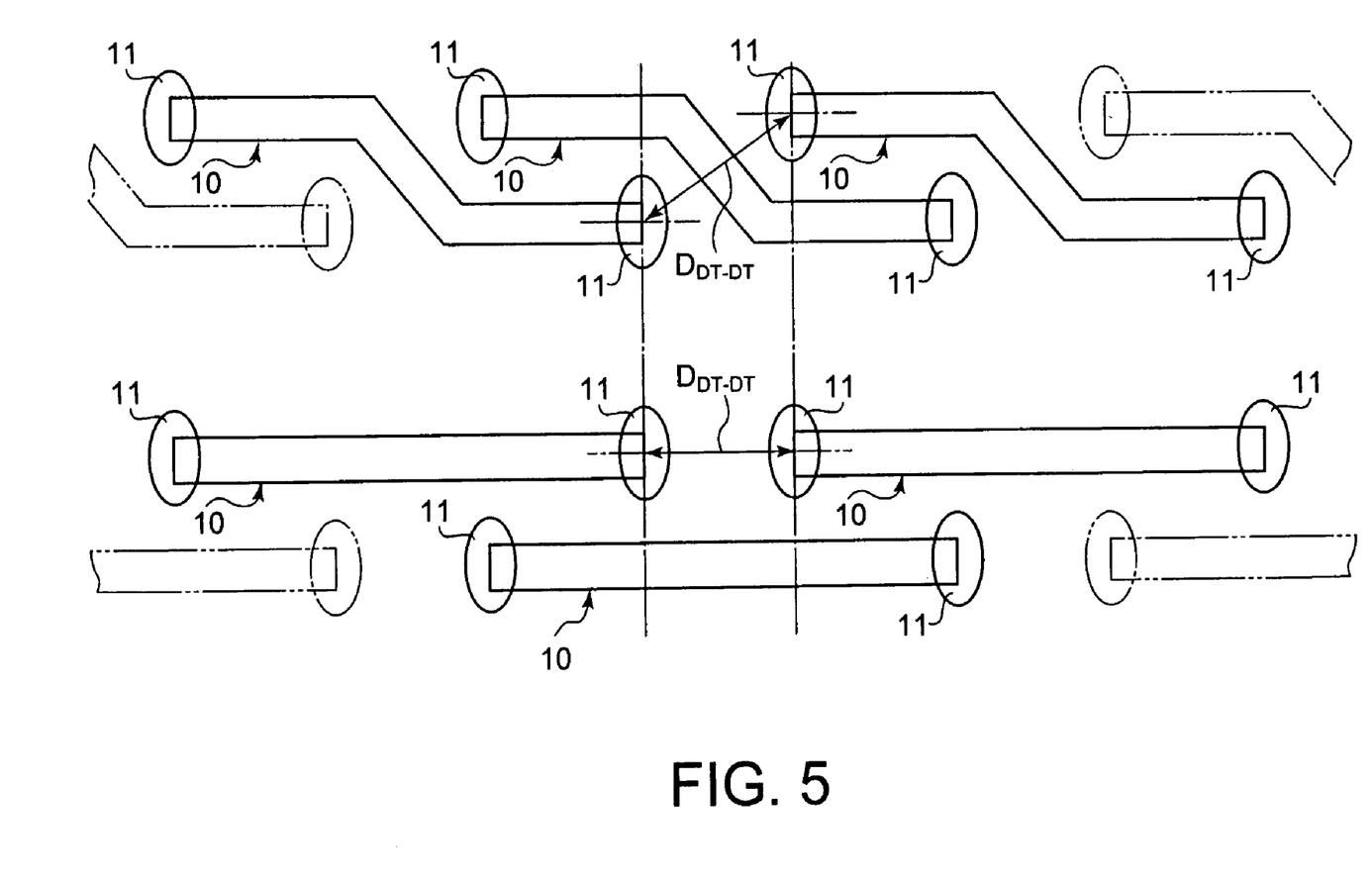
FIG. 5 is a view showing an advantage of the DRAM according to the first embodiment of the present invention.

According to the first embodiment, as shown in FIG. 5, the shortest trench-trench distance on the layout can be eased in comparison with a DRAM in which respective element regions are formed in one column and trenches are disposed at both ends thereof. Thus, restrictions on processes can be eased and, for example, it is possible to deepen the trenches and increase an aspect ratio of the trenches. Therefore, it is possible to further shrink the semiconductor device having trenches.

(Second Embodiment)

Figure 6:
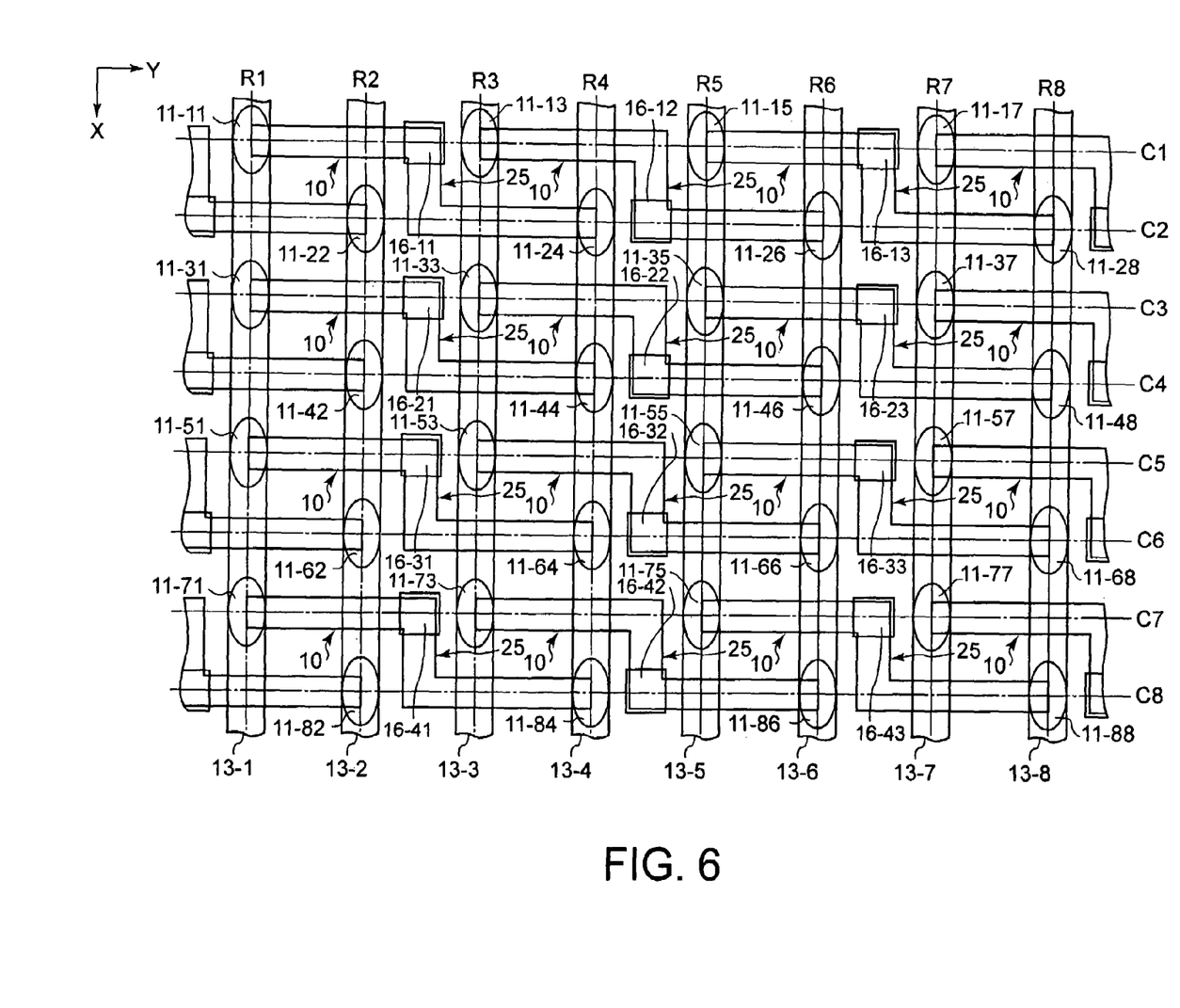
FIG. 6 is a plan view showing one layout example of a memory cell array of a DRAM according to a second embodiment of the present invention.

FIG. 6 is a plan view showing one layout example of a memory cell array of a DRAM according to a second embodiment of the present invention.

As shown in FIG. 6, the second embodiment is different from the first embodiment in that oblique portions 15 are changed to straight portions 25 which are orthogonal to the Y direction.

Furthermore, the second embodiment is different from the first embodiment in that bit line contacts 16 formed in the straight portions are disposed not in a line but alternately in the respective columns. In this example, bit line contacts 16-11, 16-13, . . . are in straight portions 25 on first column C1 and bit line contacts 16-12, . . . are in straight portions 25 on second column C2. For example, bit line 14 connected to bit line contacts 16-11, 16-13, . . . is one of the folded bit line pair and bit line/14 connected to bit line contacts 16-12, . . . is the other of the folded bit line pair. Bit line 14 is disposed above trenches 11 and bit line/14 is disposed above trenches 11. In such a manner, bit line 14 is disposed above trenches 11 and bit line contacts 16 are formed alternately in portions of bit line 14 and element regions 10 between word lines 13. In this example, bit line contacts 16 are formed alternately in straight portions 25 of element regions 10.

According to the second embodiment, layout of the trenches is the same as that of the first embodiment. Thus, as in the case of the first embodiment, the shortest trench-trench distance on the layout can be eased.

Figure 7:
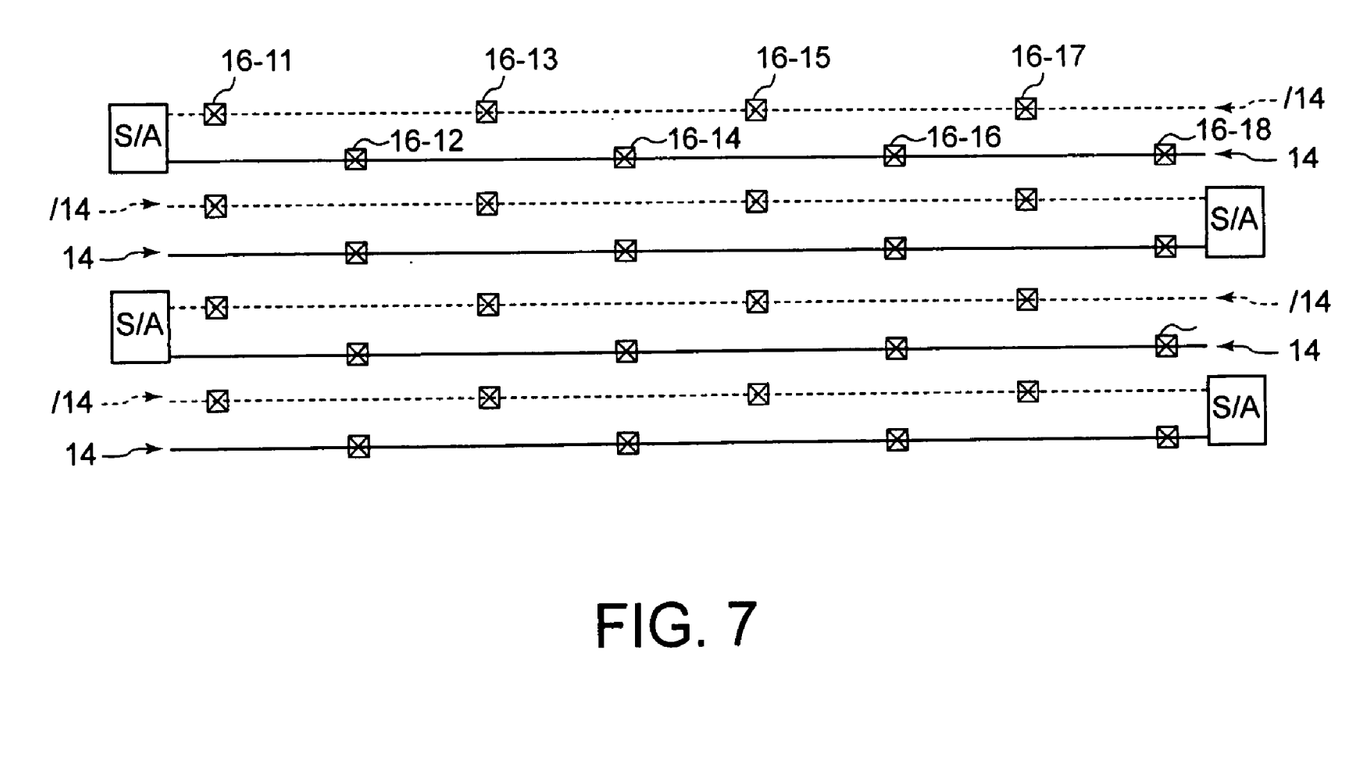
FIG. 7 is a view showing one example of a bit line.

According to the second embodiment, bit line 14 is disposed above trenches 11 and bit line contacts 16 are formed alternately in the portions of bit line 14 and element regions 10 between word lines 13. In this example, bit line contacts 16 are formed alternately in straight portions 25 of element regions 10. Thus, as shown in FIG. 7, bit line 14 can be a normal folded bit line without being a twisted bit line as in the case of the first embodiment. Consequently, formation of bit line 14 becomes easier than that of the first embodiment. Moreover, since it is not required to secure a space for twisting bit line 14, it is easy to further shrink the semiconductor device having trenches.

The second embodiment has a bit line layout similar to that of a normal DRAM. Thus, for example, a test technology of the normal DRAM can be used and tests are also easy.

Although the present invention has been described above according to the first and second embodiments, the present invention is not limited to the respective embodiments. In implementation thereof, various modifications are possible without departing from the spirit of the invention.

In the foregoing embodiments, the description was given based on the examples in which the present invention is applied to the dynamic random access memory. However, without being limited to the dynamic random access memory, the present invention is applicable as long as the semiconductor device is one having trenches. For example, the present invention can be used for a pseudo static random access memory, which has memory cells similar to those of the dynamic random access memory, or a ferroelectric random access memory.

Although the respective embodiments described above can be implemented independently, it is a matter of course that the embodiments can be combined appropriately and implemented.

The embodiments described above include inventions at various stages. By appropriately combining a plurality of structural requirements disclosed in the embodiments, the inventions at various stages can be also extracted.

In the foregoing embodiments, the description was given based on the examples in which the present invention is applied to the dynamic random access memory. However, a semiconductor device including the dynamic random access memory having the trench layout described above, the pseudo static random access memory or the ferroelectric random access memory, such as a processor and a system LSI also belongs to the present invention.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device in which a plurality of rows are set along an X direction and a plurality of columns are set along a Y direction orthogonal to the X direction, comprising:
   a first element region including a first trench disposed in a first column at one end thereof and a second trench disposed in a second column parallel to the first column at the other end thereof;
   a second element region including a third trench disposed at a position closer to the second trench than the first trench in the first column at one end thereof and a fourth trench disposed in the second column at the other end thereof;

a third element region including a fifth trench disposed at a position closer to the fourth trench than the third trench in the first column at one end thereof and a sixth trench disposed in the second column at the other end thereof;

first to sixth trench capacitors are formed in the first to sixth trenches, respectively;

a first memory cell which includes the first trench capacitor and is disposed in the first column;

a second memory cell which includes the second trench capacitor and is disposed in the second column;

a first bit line contact which is provided in the first element region and shared by the first and second memory cells;

a third memory cell which includes the third trench capacitor and is disposed in the first column;

a fourth memory cell which includes the fourth trench capacitor and is disposed in the second column;

a second bit line contact which is provided in the second element region and shared by the third and fourth memory cells;

a fifth memory cell which includes the fifth trench capacitor and is disposed in the first column;

a sixth memory cell which includes the sixth trench capacitor and is disposed in the second column;

a third bit line contact which is provided in the third element region and shared by the fifth and sixth memory cells;

a first bit line connected mutually to the first and second bit line contacts; and a second bit line connected to the third bit line contact, wherein the first element region includes an oblique portion obliquely crossing toward the second column from the first column between the first and second memory cells, the second element region includes an oblique portion obliquely crossing toward the second column from the first column between the third and fourth memory cells, the third element region includes an oblique portion obliquely crossing toward the second column from the first column between the fifth and sixth memory cells, the first bit line contact is in the oblique portion of the first element region, the second bit line contact is in the oblique portion of the second element region, the third bit line contact is in the oblique portion of the third element region, the first to third bit line contacts are disposed in a straight line along the Y direction between the first and second columns, the first bit line is one of a folded and twisted bit line pair, the second bit line is the other of folded and twisted bit line pair, and the first bit line intersects with the second bit line between the second and third bit line contacts.

2. The semiconductor device according to claim 1, wherein the first, third and fifth trenches are formed at respective intersections of odd-numbered rows and odd-numbered columns among the plurality of rows and columns and the second, fourth and sixth trenches are formed at respective intersections of even-numbered rows and even-numbered columns.

3. The semiconductor device according to claim 2, further comprising: a first trench group including the first, third and fifth trenches formed at the respective intersections of the odd-numbered rows and the odd-numbered columns among the plurality of rows and columns; a second trench group including the second, fourth and sixth trenches formed at the respective intersections of the even-numbered rows and the even-numbered columns; and an element region group including the first to third element regions which connect trenches formed at positions corresponding to coordinates (C, R) among the first trench group with trenches formed at positions corresponding to coordinates (C+1, R+3) among the second trench group, respectively.

4. A semiconductor device in which a plurality of rows are set along an X direction and a plurality of columns are set along a Y direction orthogonal to the X direction, comprising:

a first element region including a first trench disposed in a first column at one end thereof and a second trench disposed in a second column parallel to the first column at the other end thereof;

a second element region including a third trench disposed at a position closer to the second trench than the first trench in the first column at one end thereof and a fourth trench disposed in the second column at the other end thereof;

a third element region including a fifth trench disposed at a position closer to the fourth trench than the third trench in the first column at one end thereof and a sixth trench disposed in the second column at the other end thereof;

first to sixth trench capacitors are formed in the first to sixth trenches, respectively;

a first memory cell which includes the first trench capacitor and is disposed in the first column;

a second memory cell which includes the second trench capacitor and is disposed in the second column;

a first bit line contact which is provided in the first element region and shared by the first and second memory cells;

a third memory cell which includes the third trench capacitor and is disposed in the first column;

a fourth memory cell which includes the fourth trench capacitor and is disposed in the second column;

a second bit line contact which is provided in the second element region and shared by the third and fourth memory cells;

a fifth memory cell which includes the fifth trench capacitor and is disposed in the first column;

a sixth memory cell which includes the sixth trench capacitor and is disposed in the second column; and a third bit line contact which is provided in the third element region and shared by the fifth and sixth memory cells, wherein the first element region includes an orthogonal portion orthogonally crossing toward the second column from the first column between the first and second memory cells, the second element region includes an orthogonal portion orthogonally crossing toward the second column from the first column between the third and fourth memory cells, and the third element region includes an orthogonal portion orthogonally crossing toward the second column from the first column between the fifth and sixth memory cells.

5. The semiconductor device according to claim 4, wherein the first bit line contact is in the orthogonal portion of the first element region, the second bit line contact is in the orthogonal portion of the second element region, and the third bit line contact is in the orthogonal portion of the third element region.

6. The semiconductor device according to claim 5, wherein the first and third bit line contacts are on the first column and the second bit line contact is on the second column.

7. The semiconductor device according to claim 6, wherein a first bit line connected to the first and third bit line contacts is included and this first bit line is one of a folded bit line pair and a second bit line connected to the second bit line contact is included and this second bit line is the other of the folded bit line pair.

8. The semiconductor device according to claim 7, wherein the first bit line is disposed above the first, third and fifth trenches and the second bit line is disposed above the second, fourth and sixth trenches.

9. A semiconductor device in which a plurality of rows are set along an X direction and a plurality of columns are set along a Y direction orthogonal to the X direction, comprising:
- a first trench group formed at respective intersections of odd-numbered rows and odd-numbered columns among the plurality of rows and columns;
- a second trench group formed at respective intersections of even-numbered rows and even-numbered columns among the plurality of rows and columns;
- an element region group which connects trenches formed at positions corresponding to coordinates (C, R) among the first trench group with trenches formed at positions corresponding to coordinates (C+1, R+3) among the second trench group, respectively;
- trench capacitors are formed in the trenches of the first and second trench groups, respectively; and
- word lines are disposed so as to correspond to the plurality of rows, respectively,
- wherein the word lines disposed so as to correspond to the odd-numbered rows among the word lines become pass portions on the odd-numbered columns and become active portions on the even-numbered columns, and
- the word lines disposed so as to correspond to the even-numbered rows become active portions on the odd-numbered columns and become and pass portions on the even-numbered columns.

10. The semiconductor device according to claim 9, wherein the trenches of the first and second trench groups are formed under the word lines of the pass portions.

11. A semiconductor device in which a plurality of rows are set along an X direction and a plurality of columns are set along a Y direction orthogonal to the X direction, comprising:
- a first trench group formed at respective intersections of odd-numbered rows and odd-numbered columns among the plurality of rows and columns;
- a second trench group formed at respective intersections of even-numbered rows and even-numbered columns among the plurality of rows and columns;
- an element region group which connects trenches formed at positions corresponding to coordinates (C, R) among the first trench group with trenches formed at positions corresponding to coordinates (C+1, R+3) among the second trench group, respectively,
- wherein the first trench group is disposed at a first pitch along the Y direction and the second trench group is disposed at the first pitch along the X direction and is disposed while being shifted from the first trench group by ½ of the first pitch.

* * * * *